(12) United States Patent
Weisfield et al.

(10) Patent No.: US 11,269,091 B2
(45) Date of Patent: Mar. 8, 2022

(54) THRESHOLD VOLTAGE STABILIZING SYSTEM AND METHOD

(71) Applicant: Varex Imaging Corporation, Salt Lake City, UT (US)

(72) Inventors: Richard Weisfield, Los Gatos, CA (US); Kungang Zhou, Saratoga, CA (US)

(73) Assignee: Varex Imaging Corporation, Salt Lake City, UT (US)

( * ) Notice: Subject to any disclaimer, the term of this patent is extended or adjusted under 35 U.S.C. 154(b) by 73 days.

(21) Appl. No.: 16/392,376

(22) Filed: Apr. 23, 2019

(65) Prior Publication Data

US 2020/0341156 A1 Oct. 29, 2020

(51) Int. Cl.
*G01T 1/29* (2006.01)
*G01T 1/24* (2006.01)
(Continued)

(52) U.S. Cl.
CPC ........ *G01T 1/247* (2013.01); *H01L 27/14612* (2013.01); *H01L 27/14658* (2013.01); *H01L 29/7869* (2013.01); *H04N 5/32* (2013.01)

(58) Field of Classification Search
CPC ....... G01T 1/247; G01T 1/2018; G01T 1/241; G01T 1/2006; G01T 1/208; G01T 1/17; G01T 1/20; G01T 1/24; G01T 1/246; G01T 1/40; G01T 7/00; G01T 1/2928; G01T 1/026; G01T 1/2985; G01T 2200/28; G01T 2207/10116; G01T 2207/30004; G01T 5/002; G01T 5/009; G01T 5/40; H01L 31/00; H01L 27/14612; H01L 27/14658; H01L 27/14663; H01L 29/7869; H01L 21/02565; H01L 29/66969; H01L 21/02631; H01L 29/78693; H01L 27/1225; H01L 29/4908; H01L 29/78633; H01L 21/02164; H01L 21/02554; H01L 27/14616; H01L 29/24; H01L 29/78648; H01L 29/78696; H01L 21/02274; H01L 27/00; H01L 27/12; H01L 27/14609; H01L 27/14643; H01L 27/14603; H01L 27/14607; H01L 27/1463; H01L 27/14676; H01L 27/14692; H01L 27/3269;
(Continued)

(56) References Cited

U.S. PATENT DOCUMENTS 6,980,246 B1 12/2005 Ducourant
10,446,602 B2 * 10/2019 Wu ..................... H01L 27/1214
(Continued)

OTHER PUBLICATIONS

Park, Suehye, et al., Threshold voltage shift prediction for gate bias stress on amorphous InGaZnO thin film transistors, 52 Microelectronics Reliability 2215-2219 (2012).
(Continued)

*Primary Examiner* — Irakli Kiknadze
(74) *Attorney, Agent, or Firm* — Laurence & Phillips IP Law

(57) ABSTRACT

Some embodiments include a system, comprising: first circuit including a transistor having an optically sensitive threshold voltage; a light source configured to illuminate the transistor; and a control circuit configured to activate the light source based on the threshold voltage. In some embodiments, a threshold voltage of the transistor may be stabilized.

17 Claims, 12 Drawing Sheets

(51) Int. Cl.
*H04N 5/32* (2006.01)
*H01L 27/146* (2006.01)
*H01L 29/786* (2006.01)

(58) Field of Classification Search
CPC ............ H01L 31/0224; H01L 31/153; H01L 27/1255; H01L 51/003; H04N 17/002; H04N 5/32; H04N 5/361; H04N 5/353; H04N 5/3597; H04N 5/3655; H04N 1/00917; H04N 5/335; H04N 5/351; H04N 5/3741; H04N 5/347; H04N 5/2257; H04N 5/374; H04N 5/2251; H04N 5/64; C01B 19/002; C01B 19/007; C01B 21/082; A61B 6/4441; A61B 6/4464; A61B 6/585; A61B 6/12; A61B 6/42; A61B 6/4283; A61B 6/4494; A61B 6/467; A61B 6/486; A61B 6/487; A61B 6/504; A61B 6/54; A61B 6/547; A61B 6/4233; A61B 6/583; A61B 6/00; A61B 6/542; A61B 6/548; A61B 6/032; A61B 6/4208; A61B 6/4266; A61B 6/5235; A61B 6/037; A61B 6/482; A61B 6/4241; G01J 1/44; G01N 23/04; G01N 2223/419; G01N 23/046; G01N 23/223; G01N 23/2273; G01N 21/64; G01N 2223/413; G01N 2223/423; G01N 23/02; G06T 2200/28; G06T 2207/10116; G06T 2207/30004; G06T 5/002; G06T 5/009; G06T 5/40; H05G 1/64; H05G 1/44; H05B 33/14; H05B 33/02; H05B 33/22; H05B 33/28; H01J 1/34; H01J 2201/3423; H01J 2231/50031; H01J 2231/50063; H01J 2231/50068; H01J 2231/5056
USPC ............ 250/370.09; 378/98.8, 98.7, 62, 90
See application file for complete search history.

(56) References Cited

U.S. PATENT DOCUMENTS

| | | | |
|---|---|---|---|
| 10,964,745 B2* | 3/2021 | Ha | H01L 27/14603 |
| 2008/0226031 A1* | 9/2008 | Yokoyama | H04N 5/32 378/98.7 |
| 2014/0151684 A1* | 6/2014 | Wu | H01L 27/14663 257/43 |
| 2015/0034831 A1* | 2/2015 | Miyake | H01L 27/14603 250/369 |

OTHER PUBLICATIONS

Lee, Jeong-Min, et al., Bias-stress-induced stretched-exponential time dependence of threshold voltage shift in InGaZnO thin film transistors, 93 Applied Physics Letters, 093504 (2008).

Flewitt, A.J., et al., A Thermalization Energy Analysis of the Threshold Voltage Shift in Amorphous Indium Gallium Zinc Oxide Thin Film Transistors under Simultaneous Negative Gate Bias and Illumination, J. of Applied Physics, vol. 115, Isuue 13 (2014).

Niang, K.M., et al., A Thermalization Energy Analysis of the Threshold Voltage Shift in Amorphous Indium Gallium Zinc Oxide Thin Film Transistors under Positive Gate Bias Stress, Applied Physics Letters, vol. 108, Issue 9 (2016).

* cited by examiner

THRESHOLD VOLTAGE STABILIZING SYSTEM AND METHOD

BACKGROUND

Transistors, such as thin film transistors (TFTs) are used in a variety of devices. Some transistors have threshold voltages that shift over time when turned on. The shift of the threshold voltage may reduce the performance of the device and eventually render the device inoperable.

DETAILED DESCRIPTION

Embodiments described herein relate to threshold voltages of transistors and, in particular, systems and methods for stabilizing the threshold voltages.

Transistors, such as thin film transistors (TFTs) are used in a variety of applications. In some embodiments, TFTs are used in X-ray detectors. These TFTs may suffer from threshold voltage shifts during operation. In particular, amorphous silicon (a-Si) TFTs may develop a positive threshold voltage shift when the TFTs are turned on but shift negatively at a much slower rate when turned off. These shifts may balance each other in low duty cycle applications such as those used in X-ray image sensors or LCD displays.

Indium gallium zinc oxide (IGZO) TFTs may be used in X-ray detectors due to their much higher mobility and better off characteristics. The improved performance may allow faster switches, lower noise, fewer artifacts, or the like. However, a concern with IGZO TFTs (and metal oxide TFTs in general) is that a positive shift may not be compensated when the TFTs are turned off. This is because a negative shift in threshold voltage relies on the generation of holes in the metal oxide semiconductor, which is inhibited by the wide band gap of IGZO and related materials. Consequently, detectors which run continuously in the dark absent x-rays may develop large threshold voltage shifts over time periods such as several months. Exposure to x-rays may retard this process due to the creation of holes in the semiconductor, but the amount of x-ray exposure may vary widely among users and may be unreliable as the sole method to reverse threshold voltage shift.

It has been found experimentally that threshold voltage shift increases sublinearly as $t^{0.3}$ under DC positive stress. The threshold voltage may shift more than 5-6V and the on-resistance will approximately double over ten years when pulsed at a 0.1% duty cycle. As a result, a detector may be designed with 2× margin in the TFT on-resistance or operated with low duty cycle as examples to ensure long term stability. However, this may not work well for more demanding circuits such as multiplexers, shift registers, decoders, and amplifiers, all of which may have components that operate with much higher duty cycle and are more difficult to design with such large shifts in threshold voltage.

The application of light to a transistor may cause the threshold voltage to recover or drift in the opposite direction, such as drifting to become a more negative voltage. As described herein, light may be used to stabilize the threshold voltage of transistors in a circuit.

FIGS. 1-5B describe various embodiments including systems with threshold voltage stabilizing systems. FIGS. 6A-6G describe various operations of one or more of the systems of FIGS. 1-5B according to various embodiments, each of which will be described below.

Figure 1:
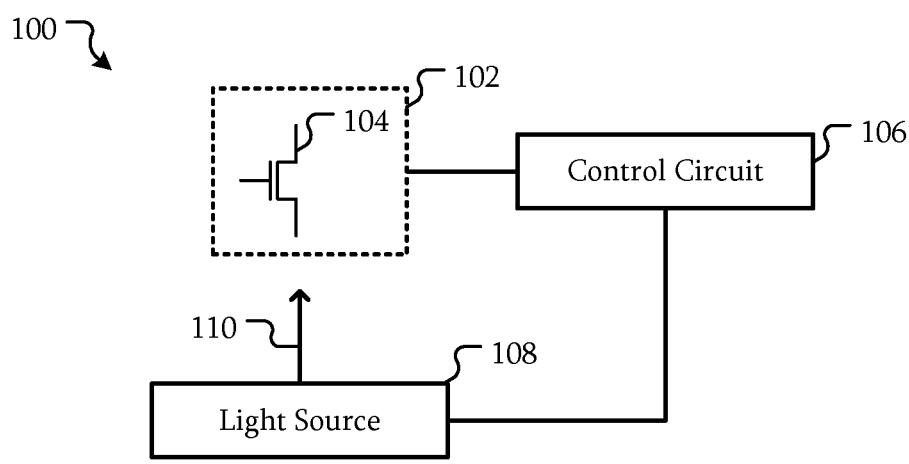
FIG. 1 is a block diagram of a threshold voltage stabilizing system according to some embodiments.

FIG. 1 is a block diagram of a threshold voltage stabilizing system according to some embodiments. The system 100 includes a first circuit 102, a control circuit 106, and a light source 108.

The first circuit 102 includes any circuit that includes a transistor 104 with an optically sensitive threshold voltage. For example, the transistor 104 may be a metal oxide transistor such as an IGZO TFT. The IGZO TFT is a transistor that includes an IGZO layer or material. However, the transistor 104 may include any transistor that has a threshold voltage that may be changed by light. Although a single transistor 104 is illustrated, the first circuit 102 may include multiple transistors identical to transistor 104, one or more other transistors similar to transistor 104, transistors formed of similar materials, transistors formed by other processes or with other materials, or the like.

The control circuit 106 is coupled to the first circuit 102 and the light source 108. The control circuit 106 may be configured to receive inputs from the first circuit 102 and generate control outputs for the light source 108. The control circuit 106 may include a processor that may be a general-purpose processor, a digital signal processor (DSP), an application specific integrated circuit, a microcontroller, a programmable logic device (e.g., field-programmable gate array [FPGA]), discrete circuits, a combination of such devices, or the like. The control circuit 106 may include internal portions, such as registers, cache memory, processing cores, or the like, and may also include external interfaces, such as address and data bus interfaces, interrupt interfaces, or the like. Multiple processors may be present. In addition, other interface devices, such as logic chipsets, hubs, memory controllers, communication interfaces, or the like may be part of the control circuit 106 to connect the control circuit 106 to and/or control the first circuit 102 and the light source 108. The control circuit 106 may include other circuitry to connect to other internal and external components.

The light source 108 includes a device configured to illuminate the transistor 104 with light 110. The light source 108 is configured to be activated by the control circuit 106.

The control circuit 106 is configured to activate the light source 108 based on the threshold voltage of the transistor 104.

The light source 108 may include any device capable of generating light 110 that may be coupled to the circuit 102 such that the transistor 104 is illuminated. In some embodiments, the light source 108 is configured to illuminate more that the transistor 104, including all transistors and/or other components of the first circuit 102. Examples of the light source 108 include an electroluminescent device or film, light emitting diodes (LEDs), LED arrays, organic LEDs (OLED), or the like. Any light source that can generate light with a sufficient intensity and wavelength to affect the threshold voltage of the transistor 104 may be used as the light source 108. Accordingly, in some embodiments, the light source 108 may be configured to generate light 110 that is outside of the visible spectrum.

In some embodiments, the wavelength of the light 110 may be optimized for absorption by the transistor 104. For example, for at least some TFTs, a deep blue or ultraviolet light source 108 may be used. Other light sources 108 may be configured to generate different wavelengths of light, different spectrums, or the like depending on the properties of the transistor 104.

The light source 108 may be disposed in a variety of configurations. For example, the light source 108 may be disposed to illuminate a back side of a wafer or integrated circuit including the first circuit 102. In another example, the light source 108 may be configured to illuminate an edge of a wafer or integrated circuit including the first circuit 102. Any configuration of the light source 108 may be used that results in light 110 being incident on the transistor 104.

Figure 6A:
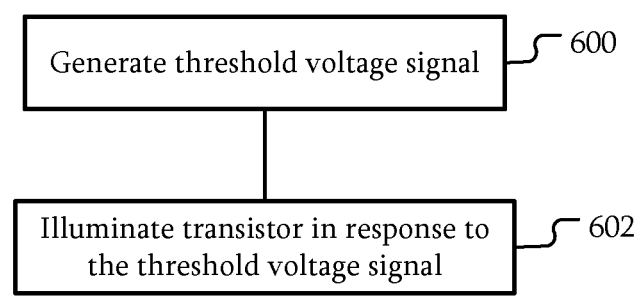
FIGS. 6A-6G are flowcharts of techniques of operating a threshold voltage stabilizing system according to some embodiments.

Referring to FIGS. 1 and 6A, in some embodiments, a threshold voltage signal is generated in 600. The threshold voltage signal is a signal based on a threshold voltage of one or more transistors such as transistor 104. In some embodiments, the threshold voltage signal includes a signal that represents the threshold voltage of the transistor 104. In other embodiments, the threshold voltage signal includes a signal that is merely dependent on the threshold voltage of the transistor 104, indicates the relationship of the threshold voltage of the transistor 104 relative to a known or reference threshold, or the like. The threshold voltage signal may take a variety of forms, such as being an analog signal, a digital signal, or the like. For example, in some embodiments, the threshold voltage signal includes a voltage that is proportional to the threshold voltage of the transistor 104 while in other embodiments, the threshold voltage signal includes a binary signal indicating whether the threshold voltage of the transistor 104 is above or below a reference threshold voltage.

The threshold voltage signal 104 may include signals based on multiple transistors similar to transistor 104. For example, analog signals such as those described above may be summed, averaged, or otherwise combined to generate the threshold voltage signal. In other embodiments, the threshold voltage signal 104 may include a digital combination of digital signals based on the threshold voltages of multiple transistors 104. For example, the threshold voltage signal may include a logical AND of binary threshold voltage signals of multiple transistors 104. In another example, the threshold voltage signal may include a count of transistors 104 having a threshold voltage that exceeds a reference threshold voltage or an indication of whether the count exceeds a threshold count.

In 602, the transistor 104 is illuminated by the light source 108 in response to the threshold voltage signal. For example, the light source 108 may be pulsed to emit a controlled amount of light 110 to the transistor 104. The light source 108 may illuminate the transistor 104 with a predetermined intensity over a time based on the threshold voltage signal. In other embodiments, the light source 108 may be controlled to illuminate the transistor 104 with an intensity that is based on the threshold voltage signal over a predetermined time. For example, the time and/or intensity may be based on an indicated difference between the threshold voltage of the transistor 104 and a desired threshold voltage or threshold voltage range. In other embodiments, the time and/or threshold may not be dependent on the threshold voltage signal. For example, the time and/or intensity may be fixed. Although in some embodiments a single pulse of the light 110 may be generated by the light source 108, in other embodiments, multiple pulses may be generated.

As described above, a system including transistors having a threshold voltage that drifts during operation may limit design options. For example, a reduced duty cycle may be required over the lifetime of the device and/or the transistors may need to be designed such that the drift over the lifetime is within acceptable limits. However, in some embodiments, controlling the light source 108 based on the threshold voltage signal allows the threshold voltage shift to be controlled. In addition, in some embodiments, controlling the light source 108 based on the threshold voltage signal may reduce or eliminate a chance that the threshold voltage is shifted too far. That is, the threshold voltage signal may indicate whether the threshold voltage is within an acceptable range and the illumination may be omitted, disabled, or the like. This degree of control allows for applications having a higher duty cycle, greater lifetime, smaller transistors, greater density, or the like where threshold voltage shift may be significant.

The addition of a light source 108 as described herein may be implemented faster than implementing new materials that may reduce the threshold voltage shift in the transistors, such as IGZO TFTs. In addition, for x-ray systems, some light sources 108, such as electroluminescent films, have a low risk that these devices will suffer long term failure due to exposure to x-rays.

Figure 6B:
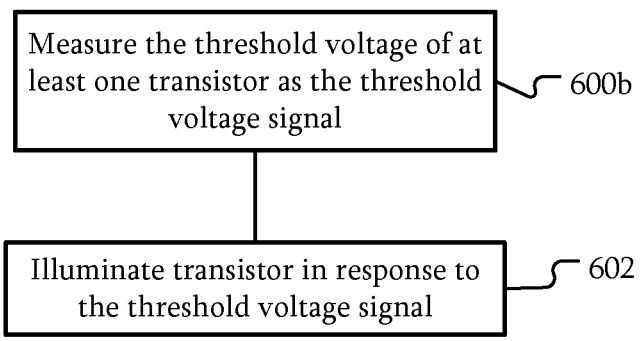

Referring to FIGS. 1 and 6B, in some embodiments, the threshold voltage signal may include the threshold voltage of the transistor 104. For example, in 600b, the threshold voltage of the transistor 104 may be measured as the threshold voltage signal. As will be described in further detail below, a variety of circuits may be used to generate the threshold voltage such as circuits including voltage sources, current sources, switches, voltmeters, ammeters, or the like to apply test signals to the transistor 104 and measure one or more voltages and/or currents to measure the threshold voltage. In 602, the transistor 104 may be illuminated in response to the threshold voltage signal, namely, the measured threshold voltage.

Although the actual threshold voltage has been used as an example of the threshold voltage signals, in some embodiments, the threshold voltage signal may include a source-drain current for a known test source-drain voltage and gate-source voltage. In another example, the threshold voltage signal may include a gate-source voltage to achieve a known source-drain current for a known source-drain voltage.

Figure 6C:
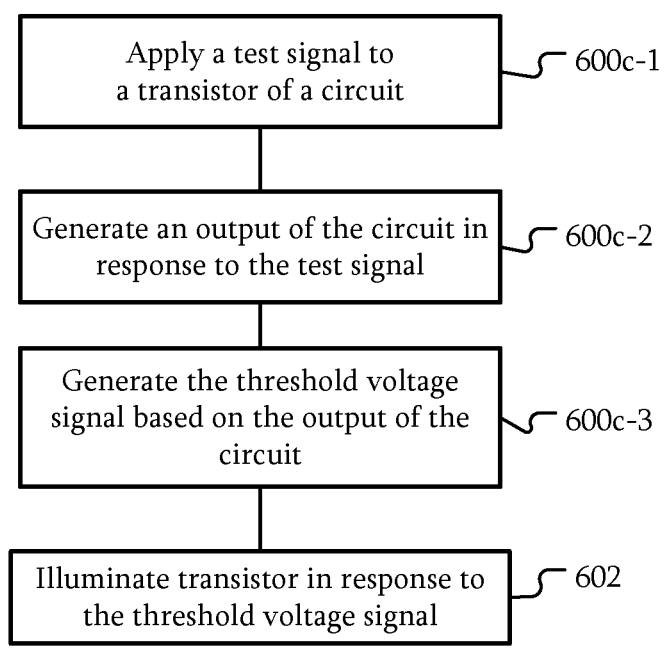

Referring to FIGS. 1 and 6C, in some embodiments, the threshold voltage signal may include an output of a circuit 102 including the transistor 104 when the transistor 104 is driven by test signals such as test voltages, test currents, or the like. For example, in 600c-1, a test signal is applied to the transistor 104. In 600c-2, an output of the circuit 102 including the transistor 104 is generated in response to the test signal. In 600c-3, the threshold voltage signal is generated in response to the output of the circuit 102. In 602, the transistor 104 may be illuminated in response to the threshold voltage signal, namely, the output of the circuit 102.

The output of the circuit 102 may take a variety of forms depending on the character of the circuit 102. For example, the gain of an amplifier including the transistor 104 may change based on the threshold voltage. A step response of the circuit 102 may change based on the threshold voltage. Any output of the circuit 102 that may depend on the threshold voltage of the transistor 104 may be used as a proxy for the threshold voltage and be used to determine whether and/or how to illuminate the transistors in 502.

Figure 6D:
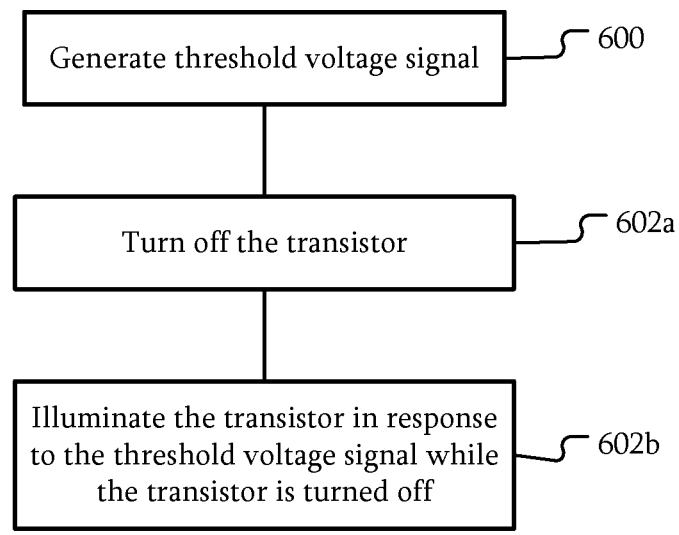

Referring to FIGS. 1 and 6D, in some embodiments, the transistor 104 may be turned off when the transistor 104 is illuminated. For example, in 600, the threshold voltage signal may be generated as described herein. In 602a, the transistor 104 may be turned off. For example, a gate-source voltage may be applied to the transistor 104 to place the transistor 104 in an off state. The particular character of the control signal to turn off the transistor 104 may be dependent on the type of transistor 104. In 602b, the transistor 104 is illuminated while the transistor 104 is turned off based on the threshold voltage signal similar to the operation in 602 described above.

In some embodiments, the threshold voltage of IGZO TFTs shift faster under negative gate voltage when illuminated. Accordingly, controlling the transistor 104 to be in an off state when illuminated by the light source 108 may reduce an amount of time to return the threshold voltage to a desired level.

Figure 2A:
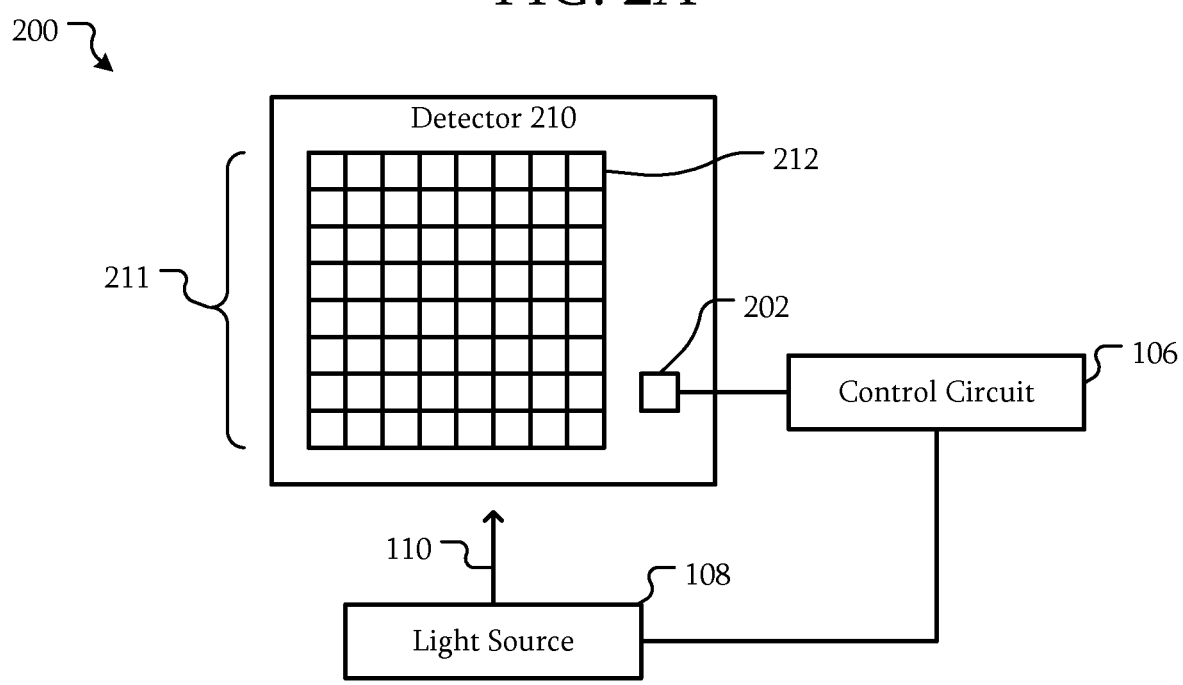
FIG. 2A is a block diagram of a detector including a threshold voltage stabilizing system according to some embodiments.
Figure 2B:
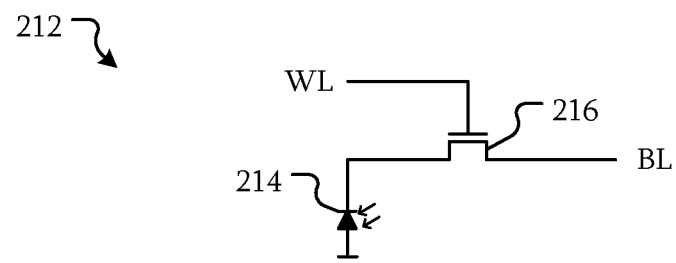
FIG. 2B is a block diagram of a pixel of the detector of FIG. 2A according to some embodiments.
Figure 2C:
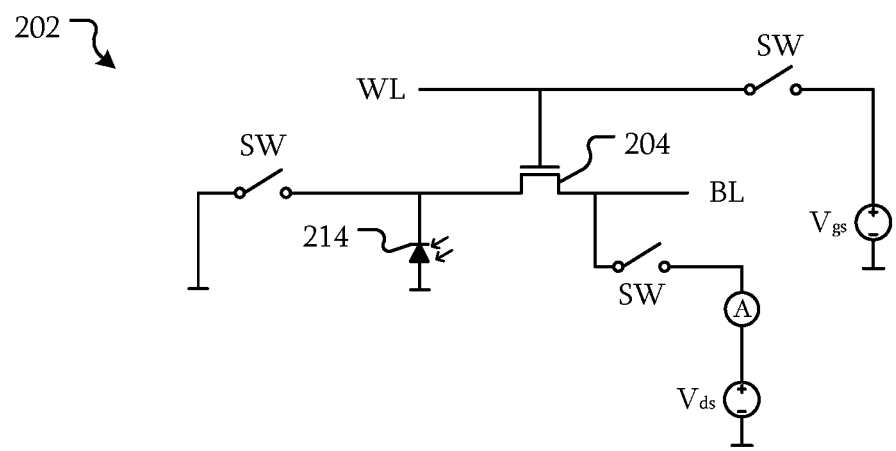
FIGS. 2C and 2D are block diagrams of probe pixels of the detector of FIG. 2A according to some embodiments.

FIG. 2A is a block diagram of a detector including a threshold voltage stabilizing system according to some embodiments. FIG. 2B is a block diagram of a pixel of the detector of FIG. 2A according to some embodiments. FIG. 2C is a block diagram of a probe pixel of the detector of FIG. 2A according to some embodiments. Referring to FIGS. 2A-2C, the system 200 is similar to the system 100 of FIG. 1. The system 200 includes a detector 210 that includes a transistor 204 similar to the transistor 104 of the system 100. In some embodiments, the detector 210, the light source 108, and/or the control circuit 106 may be integrated into a housing.

The detector 210 may include multiple pixels 212 in an array 211. These pixels 212 may form the circuitry of the detector 210 that captures an image during normal processing. FIG. 2B illustrates an example of a pixel 212. The pixel 212 may include a photosensor 214, such as a photodiode, coupled to a transistor 216. The transistor 216 may be responsive to a signal on a control line such as word line WL (e.g., provided by a row driver similar to row drivers 352 of FIG. 3). A pixel 212 may be configured to output a signal from the photosensor 214 to an output line such as the bit line BL, which may be processed by a read-out circuit such as the sample and hold and processing circuitry 354). Although a particular example of a pixel is illustrated in FIG. 2B, in other embodiments, the pixel 212 may have a different configuration, different transistors, different control signals, different outputs, or the like. In addition, the transistor 216 or similar transistors of the pixels 212 may have a threshold voltage that drifts during operation. In addition, although circuits that will be described with respect to FIG. 3 have been used as examples, in other embodiments, different circuitry may be connected to the pixels 212, generate the associated control signals, and receive associated outputs.

The detector 210 also includes a probe pixel 202. The probe pixel 202 is illustrated as being part of the detector 210, but not part of the pixels 212 of the array 211. In other embodiments, the probe pixel 202 may be disposed within the array 211, replace one of the pixels 212 of the array 211, or the like.

The probe pixel 216 is coupled to control signals such as the word line WL and to a sensing structure such as the photosensor 214. In particular, the configuration is similar or identical to that of the pixels 212. However, the probe pixel 216 also includes switches SW that may selectively couple the transistor 204 to test voltages $V_{gs}$ and $V_{ds}$ and ammeter A. Although a particular placement of switches SW and test voltages $V_{gs}$ and $V_{ds}$ have been used as an example, the test voltages' type, character, source, manner of applying, or the like may be different according to the particular In operation the transistor 204 may receive the same or similar control signals as the transistors 216 of the pixels 212. In some embodiments, the control circuit 106 is configured to generate the control signals for both the pixels 212 and the probe pixel 202. As a result, the threshold voltage of the transistor 204 may drift similar to that of the transistors 216. For example, the word lines WL of the pixels 212 and the probe pixel 202 may be activated such that each of the transistors 204 and 216 are operated for a similar time and under similar conditions. In some embodiments, the conditions may be different as long as any resulting drift in the threshold voltage of the transistor 204 is sufficiently related to that of transistors 216.

The switches SW may be used to place the probe pixel 202 into a diagnostic mode where the threshold voltage of the transistor 204 may be measured. For example, for a given $V_{ds}$, the $V_{gs}$ may be changed until the current measured by ammeter A is at a predetermined value. The resulting $V_{gs}$ may be used as the threshold voltage or as a proxy for the threshold voltage of the transistor 204 and, due to the similar operations, as a proxy for the threshold voltage of the transistors 216 of pixels 212.

Referring to FIGS. 2A-2C, 6A-6B, and 6D, the transistor 204 or 216 may be used as the transistor 104 as described above with respect to FIG. 1. For example, generating the threshold voltage signal in 600 may include measuring the current using the ammeter A, measuring a $V_{gs}$ under particular conditions, or the like as described above. In particular, the measured $V_{gs}$ may be the threshold voltage that us used as the threshold voltage signal in 600b. The transistors 204 and 216 of the pixels 202 and 212 may be turned off in 602a while being illuminated in 602b of FIG. 6D.

Figure 2D:
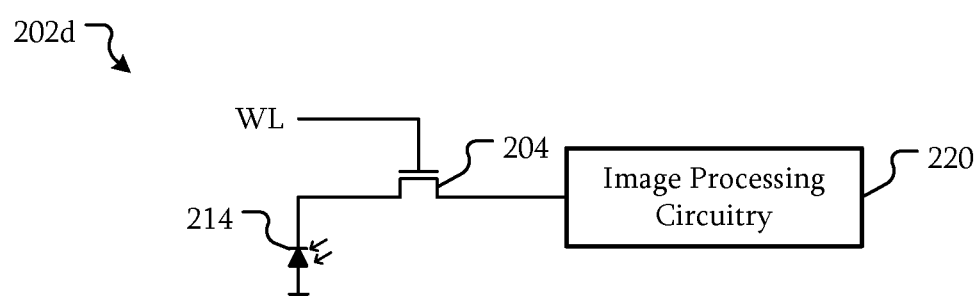

Referring to FIGS. 2A, 2D and 6C, in some embodiments, the circuit may include the probe pixel 202d as the probe pixel 202. The probe pixel 202d may be coupled to image processing circuitry 220 similar to the pixels 212. In 600c-1 a test signal is applied to a transistor 204 of the probe pixel 202d. That test signal may be a signal similar to a signal that would generate a normal output from a pixel 212, a signal that would be used to measure a dark level of a pixel 212, or the like. The test signal may be any signal or signals that cause the pixel 202d to generate an output that may be dependent on the threshold voltage of the transistor 204. That output is generated in 600c-2.

In 600c-3, the threshold voltage signal is generated based on the output of the pixel 202d. In some embodiments, switches or other signal routing techniques may be used to route an output of the probe pixel 202d to the same image processing circuitry 220 used by the pixels 212. In other embodiments, the image processing circuitry 220 may be a duplicate or similar to corresponding circuitry for the pixels 212. Accordingly, the threshold voltage signal generated in 600c-3 may include the output of the image processing circuity 220. The transistors 204 and 216 may be illuminated based on the output of the image processing circuitry in 602.

Figure 3:
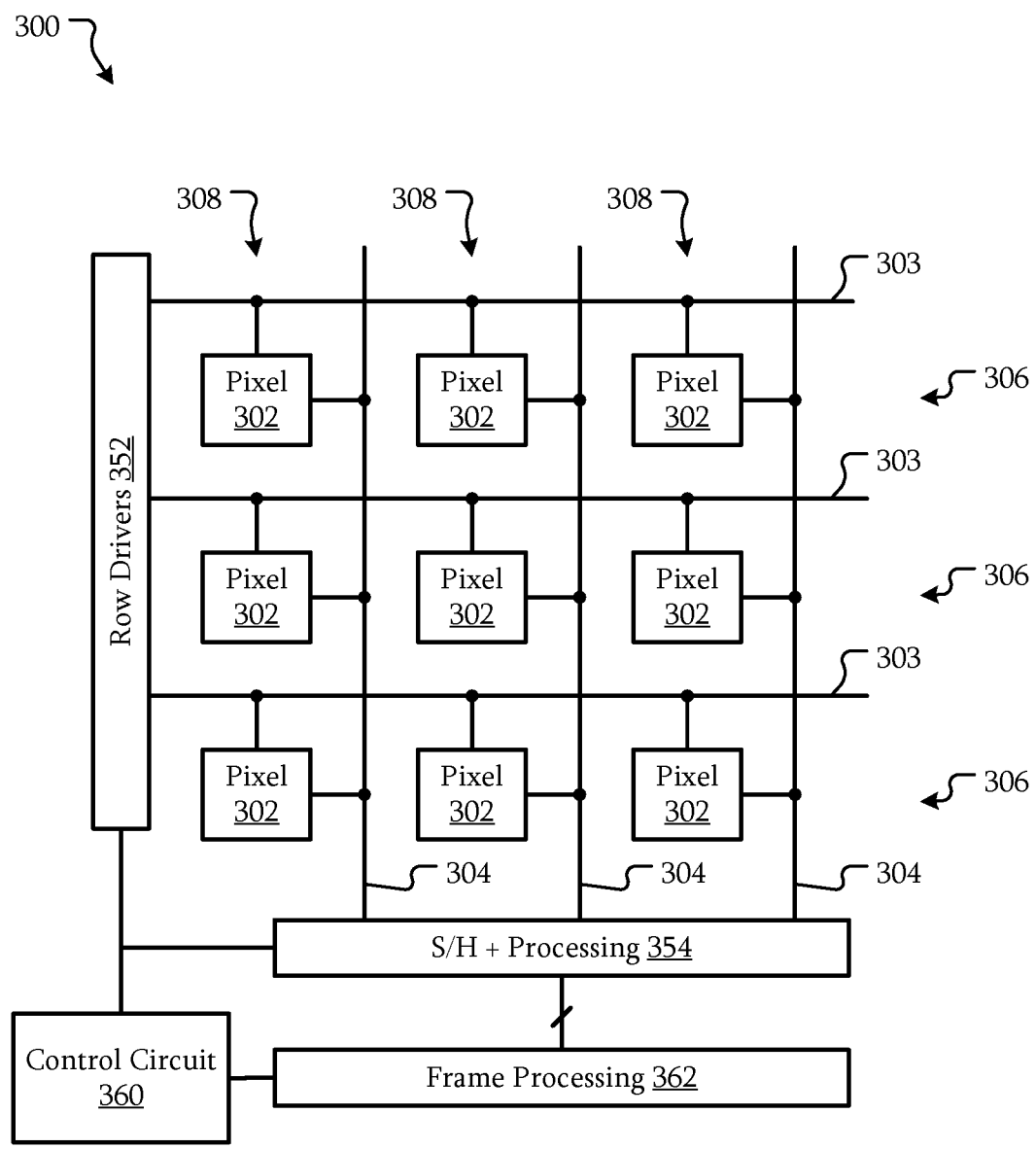
FIG. 3 is a block diagram of a detector including a threshold voltage stabilizing system according to some embodiments.

FIG. 3 is a block diagram of a detector including a threshold voltage stabilizing system according to some embodiments. The detector 300 includes pixels 302 arranged in rows 306 and columns 308. The pixels 302 and columns 300 may be similar to the pixels 212. The pixels 302 each include at least one transistor having an optically sensitive threshold voltage similar to transistor 104 of FIG. 1. Although a 3×3 detector is illustrated as an example. In other examples, the detector can be an m×n with m rows and n columns. For clarity, a light source 108 similar to those described above is not illustrated but may be present and configured to illuminate the pixels 302 and other circuitry.

The pixels 302 are coupled to a row driver 352 configured to selectively couple the pixels 302 to the column lines 304 using row select lines 303. Although row select lines 303 have been used as an example of control lines coupled between the pixels 302 and the row driver 352, the row driver 352 may include other control lines.

The column lines 304 are coupled to the sample and hold (S/H) and processing circuitry 354. The S/H and processing circuitry 354 may include circuitry configured to read output signals from a row of pixels 302 when those pixels are coupled to the column lines 304.

The frame processing circuitry 362 is configured to aggregate the outputs from rows of the pixels 302 into a frame. The S/H and processing circuitry 354 and frame processing circuitry 362 are merely examples of circuitry that may be used to generate frames images, or the like from the pixels 302.

Control circuit 360 is configured to control the row drivers 352, S/H and processing circuitry 354 and frame processing circuitry 362. The control circuit 360 may include circuitry similar to the control circuits 106 described herein.

Referring to FIGS. 3 and 6A-D, the pixels 302 may include transistors similar to transistor 104 of FIG. 1. However, in contrast to FIG. 2, the transistors that are used to generate a threshold voltage signal are the transistors 302 of the pixels themselves. In addition, the threshold voltage signal is generated using the same circuitry used to process images in normal operation. When generating the threshold voltage signal, the control circuit 360 may be configured to operate the pixels 302 and other circuitry in a manner that is identical to a normal operation while external conditions, such as the external illumination of the pixels 302, may be different. In other embodiments, the control circuit 360 may be configured to operate the pixels 302 and other circuitry with different control signals, different timing, different voltages, different currents, or the like.

In a particular example, referring to FIGS. 3 and 6C, in some embodiments, the circuit may be the detector 300. The transistor may be one or more of transistors of the pixels 302. The test signal applied in 600c-1 may be a signal used to measure a dark level of one or more of the pixels 302 and/or the detector. For example, a mid-level gate voltage may be used as a test voltage applied to one or more transistors of the pixels 302. A mid-level gate voltage may include a voltage that would put a transistor of a pixel 302 into an intermediate state between off and on for a desired threshold voltage. An output of one or more of the pixels 302 may be sampled in the S/H circuitry 354.

The dark level of the detector 300 may change based on the threshold voltage of transistors in the pixels 302. When a predetermined level of a test voltage is applied to the transistors of the pixels 302, the measured "dark level" would be based on the threshold voltage of the transistors and thus, may be used as the threshold voltage signal.

In some embodiments, the pixels 302 may be operated without internal gate compensation. That is, some circuitry in the pixels 302 and/or the row drivers 352 may be configured to adjust the gate voltages during operation. That compensation may be disabled so that the threshold voltage of the transistors of the pixels 302 may have an unmodified effect on the output of the detector 300.

In some embodiments, outputs of the pixels 302 may be combined. For example, the frame processing circuitry 362 may combine the output of multiple pixels 302 together. The dark levels of each of the pixels 302 may be combined together into an image. The individual values of pixels of the image may be combined to generate a single threshold voltage signal. For example, the individual values may be averaged. In other examples, each of the individual values may be compared with a threshold to determine if the light source 108 should illuminate the detector 300. The outputs of the pixels 302 and/or the combination of the outputs may be the output of the circuit generated in 600c-2 and used as or used to generate the threshold voltage signal in 600c-3.

In 602, the transistors of the pixels may be illuminated based on the output of the pixels 302 in response to the test signals. In some embodiments, the light source 108 may include multiple independently controllable zones configured to illuminate different groups of the pixels. The operations described herein with respect to the aggregate of the pixels 302 may be applied to the different associated zones and groups of pixels 302 as described with respect to all of the pixels 302. For example, one zone of the light source may be illuminated while another zone is not based on the outputs of the associated pixels 302. Thus, the threshold voltages of the transistors of the pixels 302 may be more individually adjusted.

In some embodiments, a calibration procedure may be performed on the detector 300. For example, when the transistors of the pixels 302 are in a state with a known threshold voltage or threshold voltage range, the dark level of the detector 300 may be generated as described above. Later, during operation, the prior dark level may be compared with a current dark level measured as described above. The comparison may be used in the decision to illuminate the transistors of the pixels 302 in 602.

Figure 6E:
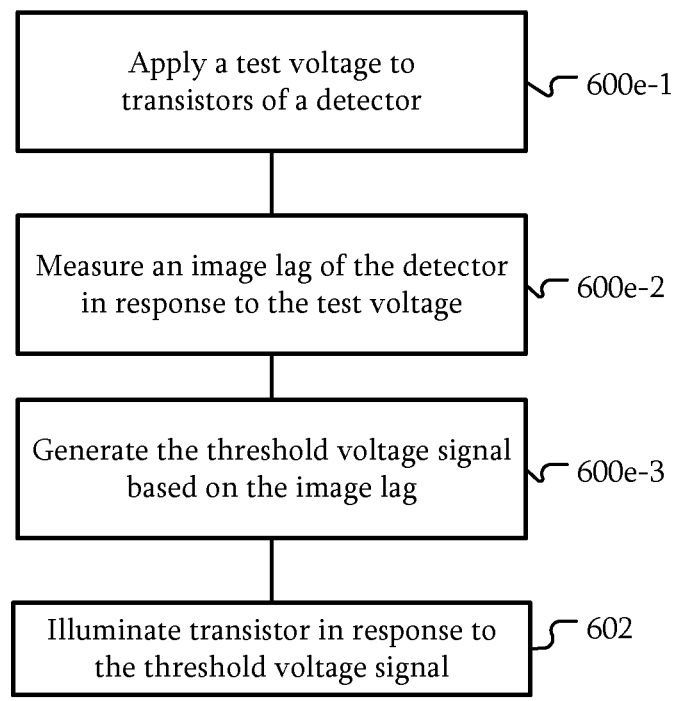

Referring to FIGS. 3 and 6E, in some embodiments, an amount of image lag that is dependent on the threshold voltage may be used as the threshold voltage signal. For example, a test voltage may be applied to transistors of the pixels 302 of the detector 300 in 600e-1. The test voltage may include a mid-level gate voltage similar to that described above when measuring the dark level; however, in other embodiments, the test voltage may be different such as including a gate voltage similar to one used to generate an image in normal operation.

In 600e-2, the image lag of the detector 300 is measured in response to the test voltage. For example, a first image may be generated by illuminating the detector 300 with a source that the detector 300 is configured to detect, such as x-rays. A second image may be generated after the first image with the illumination from the source disabled. The two images may be combined to generate an indication of the image lag, such as a percentage of the first image that appeared in the second image. Although using two images has been used as an example of images used in measuring an image lag, in other embodiments more images similar to the second image may be acquired and used to generate the indication of the image lag.

In some embodiments, the test voltage may be a normally used voltage that will turn on transistors in the pixels 302. However, that test voltage may result in conditions where image lag is more dependent on factors other than the threshold voltage. By using a test voltage that is a mid-level voltage, the resulting image lag may be more sensitive to variations in the threshold voltages of the transistors of the pixels 302. Regardless, the image lag can be used as the threshold voltage signal or used to generate the threshold voltage signal in 600e-3. Thus, the image lag may be used in the decision to illuminate the transistors of the pixels 302 using the light source 108 in 602.

Figure 4:
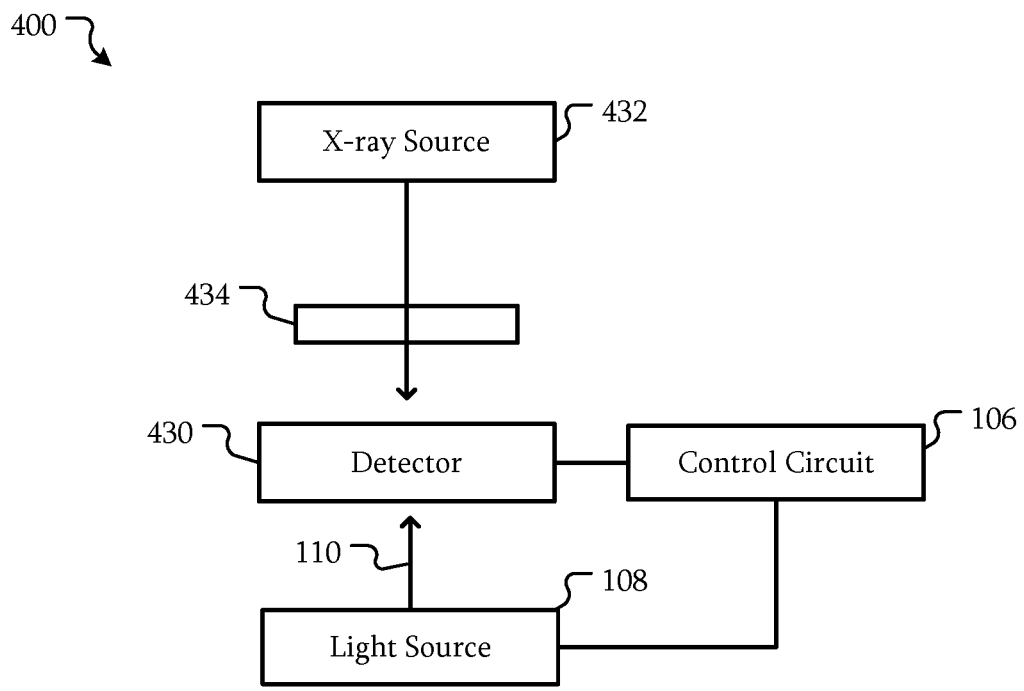
FIG. 4 is a block diagram of an x-ray system including a threshold voltage stabilizing system according to some embodiments.

FIG. 4 is a block diagram of an x-ray system including a threshold voltage stabilizing system according to some embodiments. The x-ray system 400 includes a control circuit 106, a light source 108, a detector 430, and an x-ray source 432. The control circuit 106, light source 108, and detector 430 may be similar to the control circuit 106, light source 108, circuit 102, detector 210, detector 300, or the like described above. In some embodiments, the x-ray source 432 is configured to illuminate the detector 430 with x-rays. A specimen 434, such as a patient, an object, or the like may be placed in the path of the x-rays to generate an image using the detector 430.

In some embodiments, the light source 108 may be separate from the detector 430. However, the light source 108 is still configured to emit light towards the detector 430 such that the light may impact transistors of the detector 430. In other embodiments, the light source 108 may be integrated with the detector 430 within a housing.

Figure 5A:
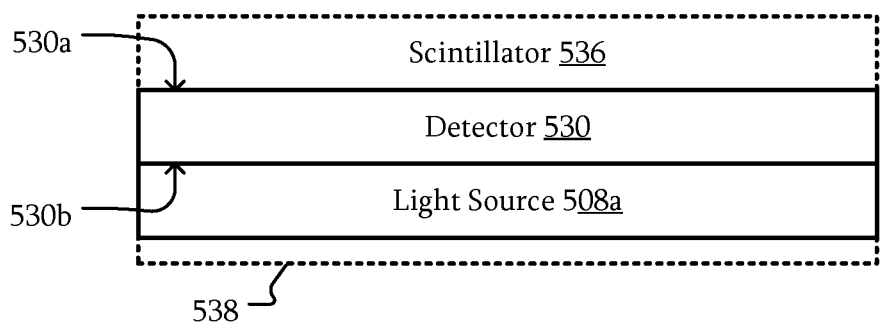
FIG. 5A-5B are a block diagrams of detectors and light sources usable with a voltage stabilizing system according to some embodiments.
Figure 5B:
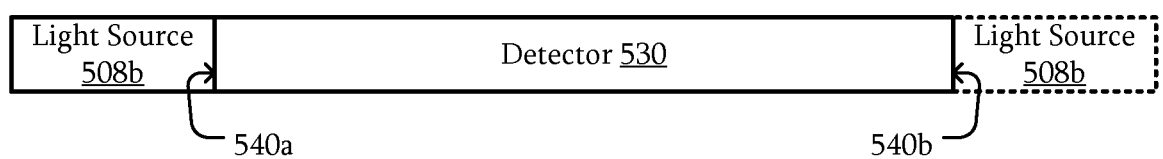

FIG. 5A-5B are a block diagrams of detectors and light sources usable with a voltage stabilizing system according to some embodiments. Referring to FIG. 5A, in some embodiments, a detector 530 has a first surface 530a and a second surface 530b on an opposite side. The first surface 530a of the detector 530 may be a surface configured to receive incident radiation, such as the x-rays from an x-ray source 432 of FIG. 4. Transistors such as transistor 104 or the like described above may be formed and/or disposed on the first side 530a of the detector 530. In some embodiments, a scintillator 536 may be attached to the first surface 530a. In other embodiments, intervening structures or layers between the scintillator 536 and the first surface 530a may be present.

A light source 508a is attached to the second surface 530b of the detector 530. Such a light source 508a may include an electroluminescent device or film, an array of LEDs, or the like that is capable of illuminating the second surface 530b of the detector 530. In some embodiments, the light source 508a may be directly attached to the second surface 530b; however, in other embodiments, other intervening structures or layers, such as a filter, diffuser, or the like, may be present.

In some embodiments, the detector 530 and the light source 508a may be mounted on a back plate 538. The detector 530, the light source 508a, and the back plate 538 may be disposed such that the light source 508a is between the detector 530 and the back plate 538.

Referring to FIG. 5B, in some embodiments, a light source 508b may be configured to illuminate an edge 540a of the detector 530. Light generated by the light source 508b may be incident on the edge 540a and pass through the detector 530, illuminating transistors within the detector 530 as described above. In some embodiments, additional light sources 508b may be attached to other edges 540b of the detector 530. Although a light source 508b being attached to one or two edges 536 of the detector 530 have been used as examples, in other embodiments, more edges 536 of the detector 530 may be illuminated by a light source 508.

Figure 6F:
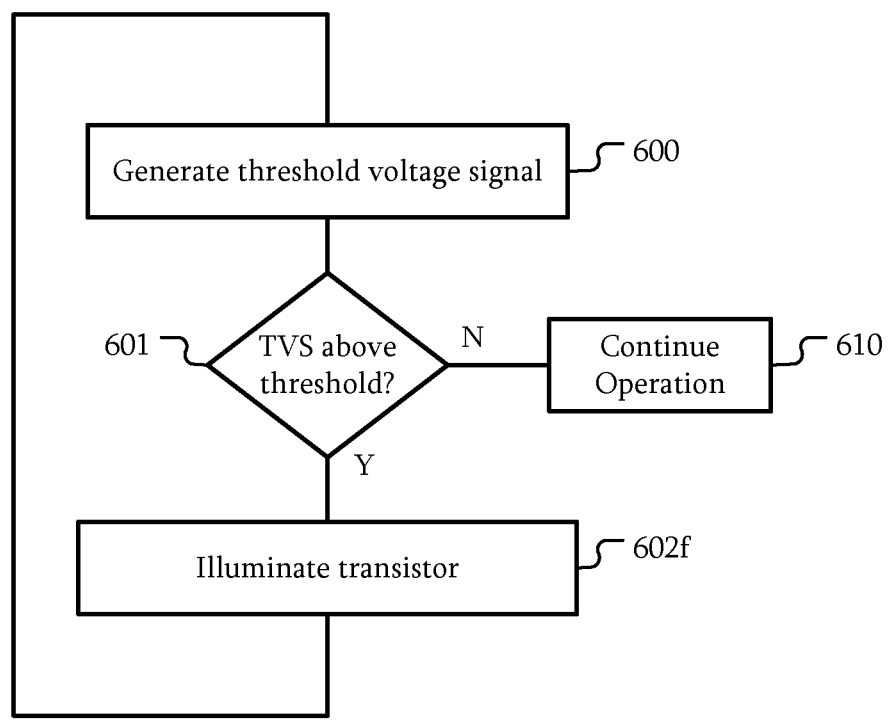

Referring to FIG. 6F, as described above, a variety of ways may be used to generate the threshold voltage signal. Any of these ways using the variety of circuits, detectors, pixels, or the like described above may be used to generate the threshold voltage signal in 600. In 601, the threshold voltage signal (TVS) is compared to a threshold to determine if it is above a threshold. The threshold may be a threshold voltage signal that would indicate that the threshold voltage of the circuitry is too high, nearing a level that is too high, at a predetermined level selected as the upper limit, or the like. If the threshold voltage signal is not above the threshold, operation may continue in 610. That is, the threshold voltage of the circuitry as indicated by the threshold voltage signal may be below the levels described above and no operation may be performed to reduce the threshold voltage.

However, if the threshold voltage signal is above the threshold, in 602f, the transistor of the circuit is illuminated using the light source 108. For example, the light source 108 may be pulsed, the transistor may be turned off while light is applied, or the like as described above. After illuminating the transistor, the threshold voltage signal may be generated again in 600. The operations may repeat until the threshold voltage signal falls below the desired level. However, in other embodiments, the operations may be repeated a number of times, repeated until another normal operation of the system is requested, or the like.

Figure 6G:
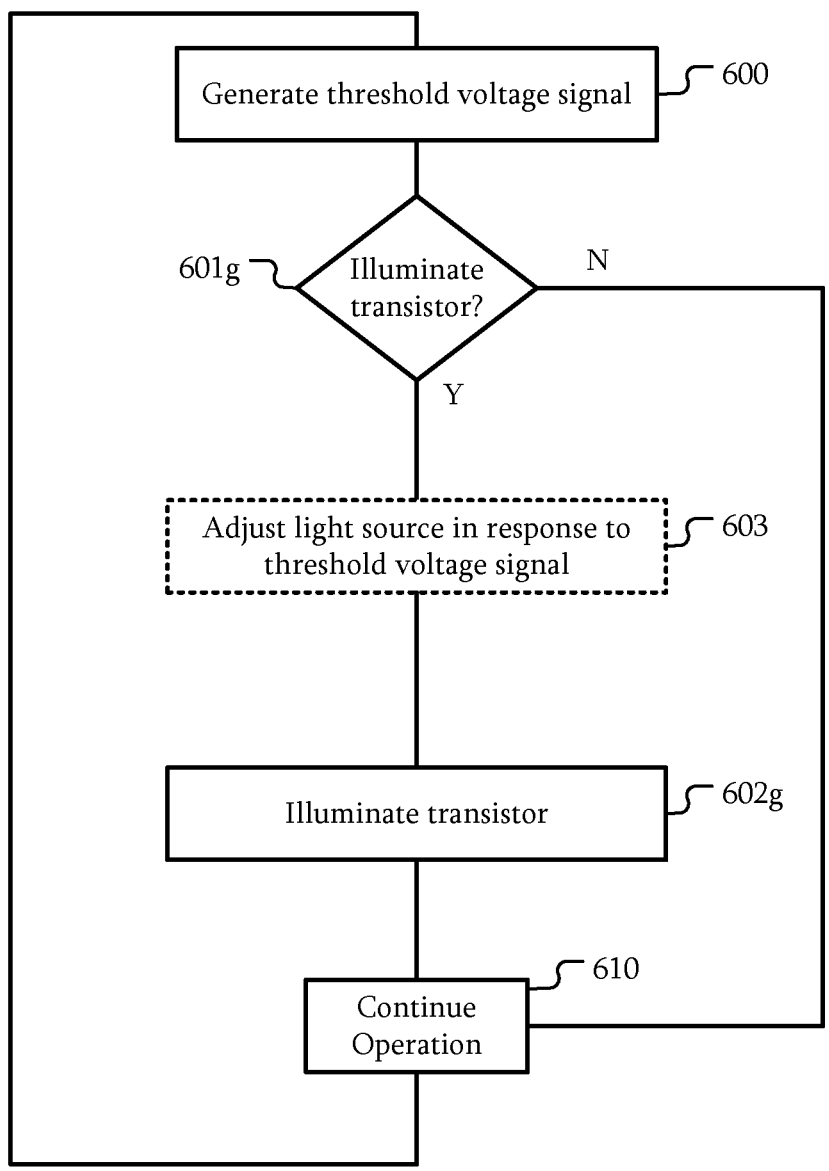

Referring to FIG. 6G, in some embodiments, the generation of the threshold voltage may be performed periodically. In 600, the threshold voltage signal is generated as described above. In 601g, a determination may be made by the control circuit whether the transistor or transistor should be illuminated. The determination may be made on a variety of conditions. As described above, in some embodiments, the threshold voltage signal may be compared to a desired level and illuminated until the threshold voltage reaches the desired level. In other embodiments, the transistor may be illuminated in 602g on a periodic basis. In other embodiments, a type of a current operation, a user control setting, or the like may be used to determine whether to illuminate the transistor in 602g.

Whether or not the transistor is illuminated in 602g, operation continues in 610. That is, regardless of the decision to illuminate the transistor in 601, the operation continues in 610. After that operation, the threshold voltage signal is generated again in 600 and the other operations repeat. Accordingly, the threshold voltage of the transistors may be checked and stabilized at substantially the same time the normal operations are performed, in a manner interleaved with normal operations, or the like.

In some embodiments, the operations continued in 610 may be the generation of an image frame. After the generation of each frame, the threshold voltage signal may be generated in 600. If the threshold voltage signal is below the threshold, another operation to generate an image frame may occur in 610. However, if the threshold voltage signal is above the threshold, the transistor may be illuminated in 602 before the next frame. As a result, the illumination of the transistor in 602g may be performed on an as-needed basis. In some embodiments, the intensity of the illumination from the light source 108 may be less than other operations described above. That is, the transistor may be illuminated by the light source 108 more frequently but with a smaller intensity.

In some embodiments, the light source 108 may be adjusted in 603 in response to the threshold voltage signal. In some embodiments, the light source 108 may be disabled, an intensity of the light source 108 is changed, an activation of the light source 108 may be omitted, or the like. Any change to the light source 108 may occur to adjust a use of the light source 108 to affect the threshold voltage of the transistor. In a particular example, the intensity of the light may be adjusted based on the difference of the threshold voltage and a desired threshold voltage. In another example, the decision to illuminate the transistor 601 may a periodic process that is not dependent on the threshold voltage signal. However, to avoid over-compensating the threshold voltage of the transistor, the light source 108 intensity may be reduced and/or the light source 108 may be disabled. Thus, a scheduled illumination may have a reduced impact or be omitted.

Although a variety of loops and decisions on whether or how to illuminate a transistor have been described above, in some embodiments, any form of feedback may be used such that a drift of the threshold voltage may be stabilized.

A variety of conditions may be used to begin the operations described herein. A frame by frame measurement of the threshold voltage signal has been used as an example; however, in some embodiments, the frequency of the operations of FIGS. 6A-6G may be performed on a variety of periods. For example, in some embodiments, the system may periodically undergo a calibration procedure, such as every six months. The operations described herein may be performed during such calibration procedures. In other embodiments, the operations may be performed on a periodic basis, such as once a day, once a month, or the like. In other embodiments, the operations may be performed whenever maintenance is performed on other parts of the system. In other embodiments, a usage of the system may be tracked. Once the usage has passed a threshold, such as a number of exposures, a number of operations, a time of operation, or the like, the operations described herein may be performed. The usage threshold may be determined based on an expected drift of the threshold voltage of the transistor 104 due to the tracked operations. In other embodiments, the operations described herein may be triggered during a start-up procedure or a shutdown procedure.

Figure 7A:
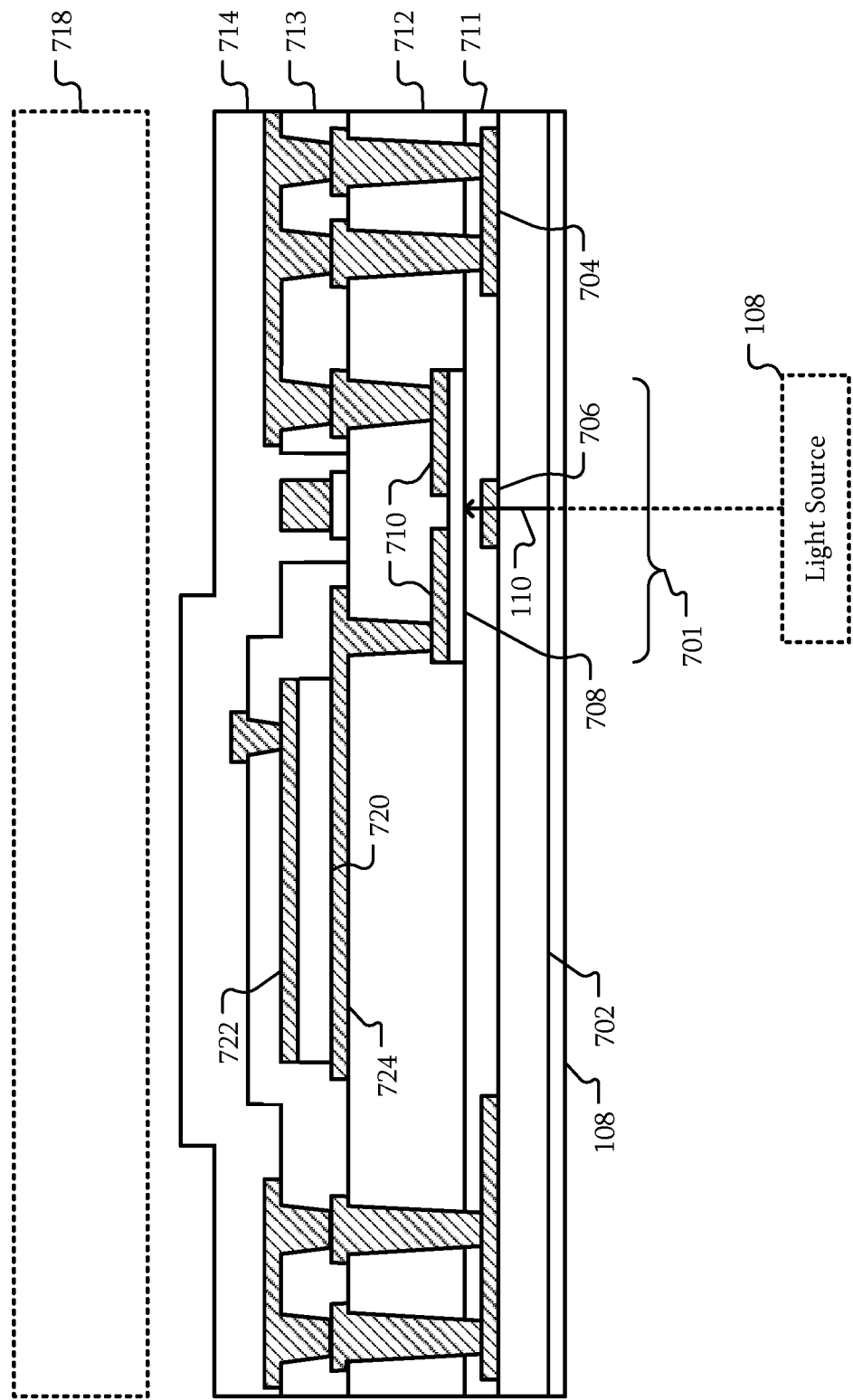
FIGS. 7A and 7B are block diagrams of at least part of a semiconductor device in a system including a threshold voltage stabilizing system according to some embodiments.
Figure 7B:
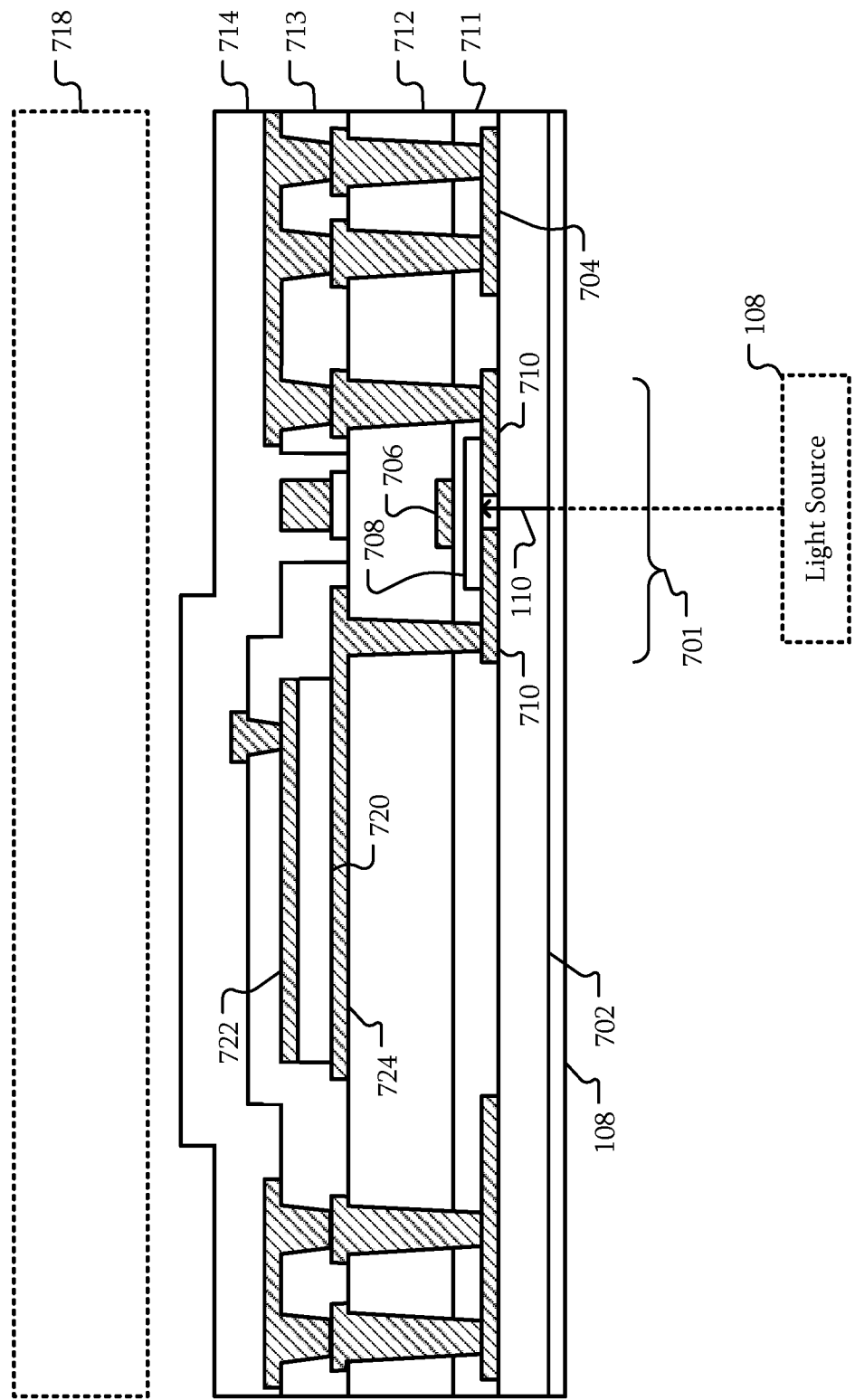

FIGS. 7A and 7B are block diagrams of at least part of a semiconductor device in a system including a threshold voltage stabilizing system according to some embodiments. Although various layers, contacts, structures, or the like may be illustrated, in some embodiments, intervening layers may be present, layers may be formed of multiple constituent layers, a number of the structures may be different, or the like. In addition, dimensions may not be to scale.

Referring to FIG. 7A, the semiconductor device 700 includes a substrate 702. The substrate 702 may be any variety of substrates on which semiconductor devices may be formed. For example, the substrate may be glass, plastic, a flexible material, a film, or the like. In some embodiments, the substrate 702 is transparent with respect to the light 110 generated by the light source 108. Here, the light source 108 is attached to the substrate 702; however, in other embodiments, the light source 108 may be separate from the substrate.

A transistor structure 701 is formed on the substrate 702 including a gate electrode 706, active material 708, and source/drain electrodes 710. In some embodiments, the active material 708 includes an IGZO layer; however, other materials may be used. A gate dielectric layer 711 may be disposed between the gate electrode 706 and the active material 708.

The semiconductor device 700 includes interlayer dielectric layers 712 and 713. Wiring, vias, or other conductive structures 704 formed in or on the interlayer dielectric layers 712 and 713. Similarly, a sensor 720 including electrodes 722 and 724 may be formed in or on the interlayer dielectric layers 712 and 713. In some embodiments, the sensor may include a photodetector as described above. In addition, the transistor structure 701 may form a transistor similar to transistors 104 or the like described above. Although two interlayer dielectric layers 712 and 713 have been used as examples, a different number of layers may be present. The semiconductor device 700 may also include a passivation layer 714.

In some embodiments, the gate electrode 706 is transparent or semi-transparent to light 110 generated by the light source 108. For example, the gate electrode 706 may be formed of indium gallium oxide (IGO), indium tin oxide (ITO), chromium, or the like. In other embodiments, the gate electrode 706 may be formed of a generally opaque conductor that is sufficiently thin to still pass a substantial portion of the light 110 from the light source 108, such as by being a refractory metal with a thickness of a few hundred angstroms. In some embodiments, the gate electrode 706 may be opaque to the light 110; however, internal reflection of the light 110 may allow at least some light to reach the channel of the transistor structure 701.

In some embodiments, the gate electrode 706 may be transparent while a gate contact, vias, signal lines, or the like may be formed from thicker materials, different materials that may be less transparent, or the like. The channel of the transistors structure 701 may still be exposed to the light 110 as the light 110 may still pass through the gate electrode 706.

In some embodiments, the gate electrode 706 may be formed using a direct alignment process. If the gate electrode 706 is transparent, the gate electrode 706 may not be suitable as a mask for a self-aligned process.

In some embodiments, a scintillator 718 may be disposed over the semiconductor device 700. The scintillator 718 may be similar to the scintillator 536 or the like described above. In some embodiments, the scintillator 718 may be attached to the semiconductor device 700.

Referring to FIG. 7B, in some embodiments, the transistor structure 701 may be inverted relative to that of FIG. 7A. As a result, the light 110 from light source 108 may not pass through the gate electrode 706. The gate electrode 706 may be formed of a material and/or have a thickness such that the gate electrode 706 is less transparent or opaque to the light 110.

Some embodiments include a system, comprising: first circuit 102 including a transistor 104, 204 having an optically sensitive threshold voltage; a light source 108, 508 configured to illuminate the transistor 104, 204; and a control circuit 106, 360 configured to activate the light source 108, 508 based on the threshold voltage.

In some embodiments, the transistor 204 is a probe transistor 204 of a probe pixel 202; the first circuit 102 comprises an integrated circuit including the probe transistor 204 and a plurality of pixel transistors 216; and the control circuit 106 is configured to operate the probe transistor 204 and the pixel transistors 216 with the same control voltages.

In some embodiments, the transistor 104, 204 is one of a plurality of transistors of a detector 210, 300, 430; and the control circuit is configured to: apply a test voltage to the transistors; measure an output of the detector 210, 300, 430 in response to the test voltage; and activate the light source 108, 508 based on the output of the detector 210, 300, 430.

In some embodiments, the transistor 104, 204 is one of a plurality of transistors 104, 204 of a detector 210, 300, 430; and the control circuit is configured to: apply a test voltage to the transistors; and measure image lag of the detector 210, 300, 430 in response to the test voltage; and activate the light source 108, 508 based on the image lag.

In some embodiments, the control circuit is configured to: periodically activate the light source 108, 508; and at least one of: disable the light source 108, 508 in response to the threshold voltage; change an intensity of the light source 108, 508 in response to the threshold voltage; and omit an activation of the light source 108, 508 in response to the threshold voltage.

In some embodiments, the control circuit is configured to activate the light source 108, 508 in response to the threshold voltage while the transistor 104, 204 is in an off state.

In some embodiments, the transistor 104, 204 includes gate having a material that is transparent to light of the light source 108, 508.

In some embodiments, the transistor 104, 204 is disposed on a first side of an integrated circuit; and the light source 108, 508 is configured to illuminate a second side of the integrated circuit opposite to the first side.

In some embodiments, the integrated circuit is part of an x-ray detector 210, 300, 430.

In some embodiments, the transistor 104, 204 is part of a pixel of an x-ray detector 210, 300, 430; and the transistor 104, 204 is an indium gallium zinc oxide (IGZO) transistor.

Some embodiments include a method, comprising: generating a signal based on a threshold voltage of at least one transistor 104, 204 of a circuit; and illuminating the at least one transistor 104, 204 by a light source separate from the at least one transistor in response to the signal.

In some embodiments, generating the signal based on the threshold voltage of the at least one transistor 104, 204 comprises measuring the threshold voltage of the at least one transistor.

In some embodiments, the at least on transistor 104, 204 comprises a plurality of transistors 104, 204 of a detector 210, 300, 430; and generating the signal based on the threshold voltage of the at least one transistor 104, 204 comprises: applying a test voltage to the transistors; generating an output of the detector 210, 300, 430 in response to the test voltage; and generating the signal based on the output of the detector 210, 300, 430.

In some embodiments, the at least on transistor 104, 204 comprises a plurality of transistors 104, 204 of a detector 210, 300, 430; and generating the signal based on the threshold voltage of the at least one transistor 104, 204 comprises: applying a test voltage to the transistors; measuring an image lag of the detector 210, 300, 430 in response to the test voltage; and generating the signal based on an image lag.

In some embodiments, the method further comprises turning off the at least one transistor 104, 204 while illuminating the at least one transistor 104, 204 in response to the signal.

In some embodiments, the method further comprises repeating the generating of the signal and the illuminating of the at least one transistor 104, 204 until the signal indicates that the threshold voltage has passed a threshold.

In some embodiments, the at least on transistor 104, 204 is disposed on a substrate with a plurality of transistors 104, 204 of a detector 210, 300, 430; and illuminating the at least one transistor 104, 204 in response to the signal comprises illuminating the transistors 104, 204 of the detector 210, 300, 430.

In some embodiments, the method further comprises applying the same control signals to the at least on transistor 104, 204 as applied to at least one of the transistors 104, 204 of the detector 210, 300, 430.

Some embodiments include a system, comprising: means for generating a signal based on a threshold voltage of at least one transistor of a circuit; and means for illuminating the at least one transistor in response to the signal. Examples of the means for generating a signal include the transistors 104, 204, the circuit 102, the detectors 210, 300, 430, the control circuit 106, the pixels 202 and 212, or the like. Examples of the means for illuminating the at least one transistor in response to the signal include the control circuit 106 and the light source 108, 508 or the like.

In some embodiments, the system further comprises means for turning off the at least one transistor while illuminating the at least one transistor in response to the signal. Examples of the means for turning off the at least one transistor while illuminating the at least one transistor in response to the signal include the circuit 102, the detectors 210, 300, 430, the control circuit 106, the pixels 202 and 212, or the like.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claim 1, 2, or 3, with these separate dependencies yielding three distinct embodiments; claim 6 can depend from any one of claim 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112(f). Embodiments of the invention in which an exclusive property or privilege is claimed are defined as follows.

The invention claimed is:

1. A system, comprising:
    a first circuit including a transistor having an optically sensitive threshold voltage;
    a light source configured to illuminate the transistor; and
    a control circuit configured to activate the light source based on the threshold voltage while the transistor is in an off state.

2. The system of claim 1, wherein:
    the transistor is a probe transistor of a probe pixel;
    the first circuit comprises an integrated circuit including the probe transistor and a plurality of pixel transistors; and
    the control circuit is configured to operate the probe transistor and the pixel transistors with the same control voltages.

3. The system of claim 1, wherein:
    the transistor is one of a plurality of transistors of a detector; and
    the control circuit is configured to:
        apply a test voltage to the transistors;
        measure an output of the detector in response to the test voltage; and
        activate the light source based on the output of the detector.

4. The system of claim 1, wherein:
    the transistor is one of a plurality of transistors of a detector; and
    the control circuit is configured to:
        apply a test voltage to the transistors; and
        measure image lag of the detector in response to the test voltage; and
        activate the light source based on the image lag.

5. The system of claim 1, wherein:
    the control circuit is configured to:
        periodically activate the light source; and
        at least one of:
            disable the light source in response to the threshold voltage;
            change an intensity of the light source in response to the threshold voltage; and
            omit an activation of the light source in response to the threshold voltage.

6. The system of claim 1, wherein:
    the transistor includes a gate having a material that is transparent to light of the light source.

7. The system of claim 1, wherein:
    the transistor is disposed on a first side of an integrated circuit; and
    the light source is configured to illuminate a second side of the integrated circuit opposite to the first side.

8. The system of claim 7, wherein:
    the integrated circuit is part of an x-ray detector.

9. The system of claim 1, wherein:
    the transistor is part of a pixel of an x-ray detector; and
    the transistor is an indium gallium zinc oxide (IGZO) transistor.

10. A method, comprising:
    generating a signal based on a threshold voltage of at least one transistor of a circuit;
    illuminating the at least one transistor by a light source separate from the at least one transistor in response to the signal; and
    turning off the at least one transistor while illuminating the at least one transistor in response to the signal.

11. The method of claim 10, wherein generating the signal based on the threshold voltage of the at least one transistor comprises measuring the threshold voltage of the at least one transistor.

12. The method of claim 10, wherein:
    the at least on transistor comprises a plurality of transistors of a detector; and
    generating the signal based on the threshold voltage of the at least one transistor comprises:
        applying a test voltage to the transistors;
        generating an output of the detector in response to the test voltage; and
        generating the signal based on the output of the detector.

13. The method of claim 10, wherein:
    the at least on transistor comprises a plurality of transistors of a detector; and
    generating the signal based on the threshold voltage of the at least one transistor comprises:
        applying a test voltage to the transistors;
        measuring an image lag of the detector in response to the test voltage; and
        generating the signal based on an image lag.

14. The method of claim 10, further comprising:
    repeating the generating of the signal and the illuminating of the at least one transistor until the signal indicates that the threshold voltage has passed a threshold.

15. The method of claim 10, wherein:
    the at least on transistor is disposed on a substrate with a plurality of transistors of a detector; and
    illuminating the at least one transistor in response to the signal comprises illuminating the transistors of the detector.

16. The method of claim 15, further comprising applying the same control signals to the at least on transistor as applied to at least one of the transistors of the detector.

17. A system, comprising:
    a circuit including at least one transistor having an optically sensitive threshold voltage;
    means for generating a signal based on the threshold voltage of the at least one transistor;
    means for illuminating the at least one transistor in response to the signal; and
    means for turning off the at least one transistor while illuminating the at least one transistor in response to the signal.

* * * * *